United States Patent
Chiou

(10) Patent No.: US 6,218,871 B1
(45) Date of Patent: Apr. 17, 2001

(54) CURRENT-SWITCHING METHOD AND CIRCUIT FOR DIGITAL-TO-ANALOG CONVERTERS

(75) Inventor: Gwo-Shu Chiou, Hsinchu Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/272,462

(22) Filed: Mar. 19, 1999

(30) Foreign Application Priority Data

Aug. 13, 1998 (TW) ................................................. 87113312

(51) Int. Cl.[7] ...................................................... H03M 1/66
(52) U.S. Cl. ................................. 327/77; 327/81; 327/88; 341/136
(58) Field of Search ..................................... 341/136, 143, 341/144; 327/77, 78, 79, 80, 81, 88, 89

(56) References Cited

U.S. PATENT DOCUMENTS

| | | | |
|---|---|---|---|
| 5,023,614 | * 6/1991 | Fung et al. | 341/144 |
| 5,148,065 | * 9/1992 | Krenik et al. | 327/382 |
| 5,331,322 | * 7/1994 | Cha et al. | 341/136 |
| 5,905,452 | * 5/1999 | Back | 341/136 |
| 5,909,187 | * 6/1999 | Ahuja | 341/136 |

* cited by examiner

*Primary Examiner*—Tuan T. Lam
(74) *Attorney, Agent, or Firm*—Jiawei Huang; J C Patents

(57) ABSTRACT

A current-switching method and circuit is provided for use with digital-to-analog converters (DACs) to provide improved compliance and linearity in the output current characteristic. In the current-switching circuit, an additional transistor that is set to a permanently-on state is connected at the output port of the current-switching circuit, which can help increase the output impedance of the current-switching circuit. Moreover, the problem of simultaneous switching-off of two control transistors can be eliminated by connecting the gate of one transistor to a reference voltage whose magnitude is set between the logic-high and logic-low voltage states of the input digital signal. The current-switching method and circuit can therefore meet the requirements of 3 V working voltage with 1.2 V output compliance and the requirements of 10 bits linearity in the output current characteristic.

25 Claims, 6 Drawing Sheets

CURRENT-SWITCHING METHOD AND CIRCUIT FOR DIGITAL-TO-ANALOG CONVERTERS

CROSS-REFERENCE TO RELATED APPLICATION

This application claims the priority benefit of Taiwan application serial no. 87113312, filed Aug. 13, 1998, the full disclosure of which is incorporated herein by reference.

BACKGROUND OF THE INVENTION

1. Field of the Invention

This invention relates to electronics, and more particularly, to a current-switching method and circuit for digital-to-analog converters (DACs) with improved compliance and linearity in the output current.

2. Description of Related Art

Most conventional DACs are constructed based on a current-switching architecture. Earlier current-switching circuits are designed to operate at 5 V (i.e., the high-voltage logic state of the digital input is 5 V). However, today's digital systems are typically designed to operate at 3.3 V or 3 V. Therefore, when a conventional 5 V current-switching circuit is used on a 3 V digital system, it would not meet the required 1.2 V compliance and high linearity in the output current characteristic. Two such conventional current-switching circuits are illustratively depicted in the following with reference to FIGS. 1 and 2 respectively.

FIG. 1 is a schematic circuit diagram of a first conventional current-switching circuit for DAC. As shown, this current-switching circuit is composed of three MOS transistors M1, M2, M3. The first MOS transistor M1 serves as a fixed current source. The second MOS transistor M2 has a gate G2 connected to receive a first digital input DIN, while the third MOS transistor M3 has a gate G3 connected to receive a second digital input DINB. Whether the output port $T_{IOUT}$ of the current-switching circuit outputs current or not is dependent on the logic combination of the first and second digital inputs DIN, DINB, This current-switching circuit can operate at 3 V ($V_{CC}$=3V) and therefore can be used in conjunction with a 3 V digital system.

One drawback to the foregoing current-switching circuit, however, is that during the switching of the first and second digital inputs DIN, DINB from one logic sate to the other (either from low to high or from high to low), there exists a short period in which both of the two MOS transistors M2, M3 are switched simultaneously to the OFF state, thus leading to the undesired occurrence of a current spike in the output current IOUT. One solution to this problem is to incorporate buffer means (not shown) to the current-switching circuit. To do this, however, the overall chip size to implement the current-switching circuit will be increased.

Still one drawback to the foregoing current-switching circuit is that the linearity in the output current characteristic is poor due to the reason that MOS transistor M3, which operates in the triode region, is used at the output port of the current-switching circuit to provide the 1.2 V output compliance, which is insufficient to provide a high enough output impedance at the output port of the current-switching circuit. Therefore, the linearity in the output current characteristic is still unsatisfactory.

Another solution to the problem of the simultaneous switching-off of the two MOS transistors M2, M3 in the circuit of FIG. 1 is shown in FIG. 2. The current-switching circuit of FIG. 2 is substantially identical in circuit structure as the one shown in FIG. 1, except that the input to the gate G3 of the third MOS transistor M3 is here a fixed reference voltage VREF instead of the digital input DINB. This modification can help prevent the two MOS transistors M2, M3 from being simultaneously switched to the OFF state. However, the linearity in the output current characteristic is nonetheless unsatisfactory.

SUMMARY OF THE INVENTION

It is therefore an objective of the present invention to provide a current-switching method and circuit for DAC, which allows the output current to have better compliance and linearity as compared to the prior art.

It is another objective of the present invention to provide a current-switching method and circuit for DAC, which can meet the requirements of 3 V working voltage and 1.2 V output compliance and can meet the requirement of 10 bits linearity.

In accordance with the foregoing and other objectives of the present invention, an improved current-switching method and circuit is provided.

The current-switching circuit of the invention includes: a fixed current source for supplying a fixed current, a first MOS transistor, a second MOS transistor and a third MOS transistor. The first MOS transistor has a gate connected to receive the input digital signal and two source/drain ends, one of which is connected to the output end of the fixed current source and the other is connected to a first logic voltage point. The second MOS transistor has a gate connected to receive a fixed reference voltage whose magnitude is set between the logic-high and logic-low voltage states of the input digital signal, and two source/drain ends, one of which is connected to the output end of the fixed current source and the other is connected to a node. The third MOS transistor has a gate connected to a fixed voltage that sets the third MOS transistor at a permanently-ON state, and two source/drain ends, one of which is connected to the node connected to the second MOS transistor and the other serves as the output port of the current-switching circuit.

The method of the invention includes providing a fixed current source. A first MOS transistor is provided, wherein a gate thereof is connected to receive the input digital signal, with one of the source/drain ends thereof being connected to the output end of the fixed current source and the other being connected to a fixed voltage point. A second MOS transistor is provided, wherein a gate thereof is connected to receive a fixed reference voltage whose magnitude is set between the high-voltage and low-voltage logic states of the input digital signal, with one of the source/drain ends thereof being connected to the output end of the fixed current source and the other being connected to a node. A third MOS transistor is provided, wherein a gate thereof is connected to the first voltage point, with one of the source/drain ends thereof being connected to the node connected to one of the source/drain ends of the second MOS transistor other than that connected to the output end of the fixed current source, and the other one of the source/drain ends being connected to the output port of the current-switching circuit.

In the current-switching circuit, the third MOS transistor that is set to a permanently-on state is connected at the output port of the current-switching circuit, which can help increase the output impedance of the current-switching circuit. Moreover, the problem of simultaneous switching-off of two control transistors, which consists of the first MOS transistor and the second MOS transistor, can be eliminated by connecting the gate of the second MOS transistor to the reference voltage. The current-switching method and circuit can therefore meet the requirements of 3 V working voltage with 1.2 V output compliance and the requirements of 10 bits linearity in the output current characteristic.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 3:
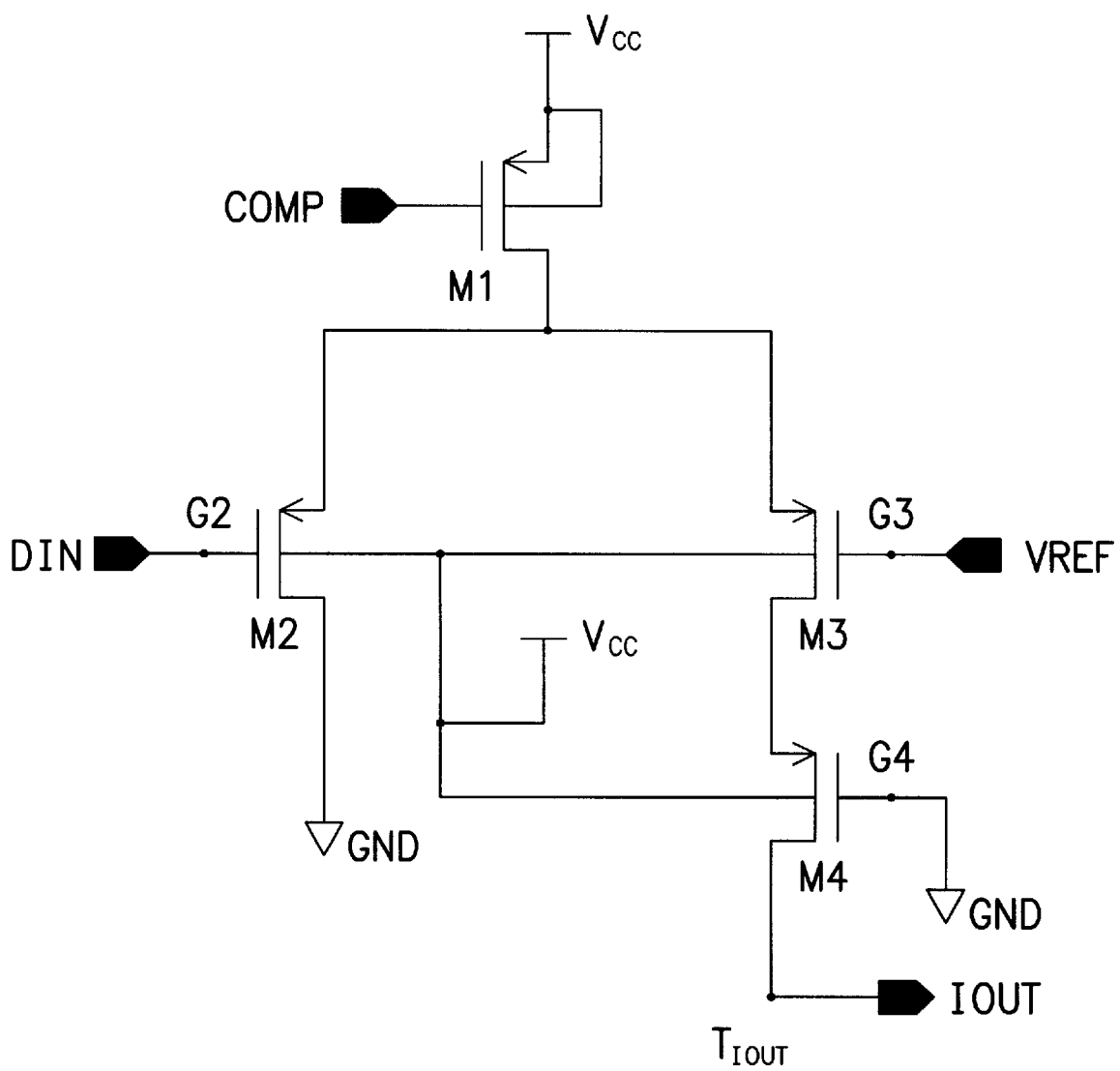
FIG. 3 is a schematic circuit diagram of the current-switching circuit for DAC according to the invention.

FIG. 3 is a schematic circuit diagram of the current-switching circuit for DAC according to the invention. As shown, the current-switching circuit of the invention is composed of four MOS transistors M1, M2, M3, M4. These MOS transistors M1, M2, M3, M4 can be either PMOS (P-type MOS) or NMOS (N-type MOS) transistors. In the preferred embodiment of FIG. 3 for example, all the four MOS transistors M1, M2, M3, M4 are PMOS transistors. This current-switching circuit is used to output an electrical current IOUT switchably controlled by a digital input DIN.

The first MOS transistor M1 is used to serve as a fixed current source, and is connected in such a manner that its gate is connected to a control signal COMP; its source is connected to the system voltage $V_{CC}$; its drain is used to serve as the current output port; and its substrate is connected to its source connected to the system voltage $V_{CC}$.

The second MOS transistor M2 is connected in such a manner that its gate G2 is connected to receive the digital input DIN; its source is connected to the drain of the first MOS transistor M1; its drain is connected to the ground GND; and its substrate is connected to the system voltage $V_{CC}$.

The third MOS transistor M3 is connected in such a manner that its gate G3 is connected to a fixed reference voltage VREF whose magnitude is set between the logic-high and logic-low voltage states of the digital input DIN; its source is connected to the drain of the first MOS transistor M1; its drain is connected to the source of the fourth MOS transistor M4; and its substrate is connected to the system voltage $V_{CC}$.

The fourth MOS transistor M4 is connected in such a manner that its gate G4 is connected to the ground GND; its source is connected to the drain of the third MOS transistor M3; its drain serves as the output port of the output current IOUT of the current-switching circuit; and its substrate is connected to the system voltage $V_{CC}$. Since the gate G4 is connected to the ground, the fourth MOS transistor M4 is set at a permanently-ON state.

The scheme of connecting the substrate of every one of the four MOS transistors M1, M2, M3, M4 to the system voltage $V_{CC}$ can help prevent the conduction at the P-N junction between the substrate and the source/drain region of each of the MOS transistors M1, M2, M3, M4.

In the foregoing circuit configuration, it prevents the simultaneous switching-off of the two MOS transistors M2, M3 through the gate of MOS transistor M3 is connected to the reference voltage VREF, the addition of the fourth MOS transistor M4, which is set at a permanently-ON state connect to the third MOS transistor M3 allows an increase in the output impedance of the current-switching circuit. Therefore, the current-switching circuit of the invention can meet the requirements of 3 V working voltage with 1.2 V output compliance and the required 10 bits linearity in the output current characteristic.

In operation, when the voltage state of the digital input DIN is less than the reference voltage VREF, the output port $T_{IOUT}$ of the current-switching circuit will output no electrical current; whereas, when greater than the reference voltage VREF, the output port $T_{IOUT}$ will output an electrical current. In other words, whether an electrical current is output from the current-switching circuit is digitally controlled by the digital input DIN.

Figure 5:
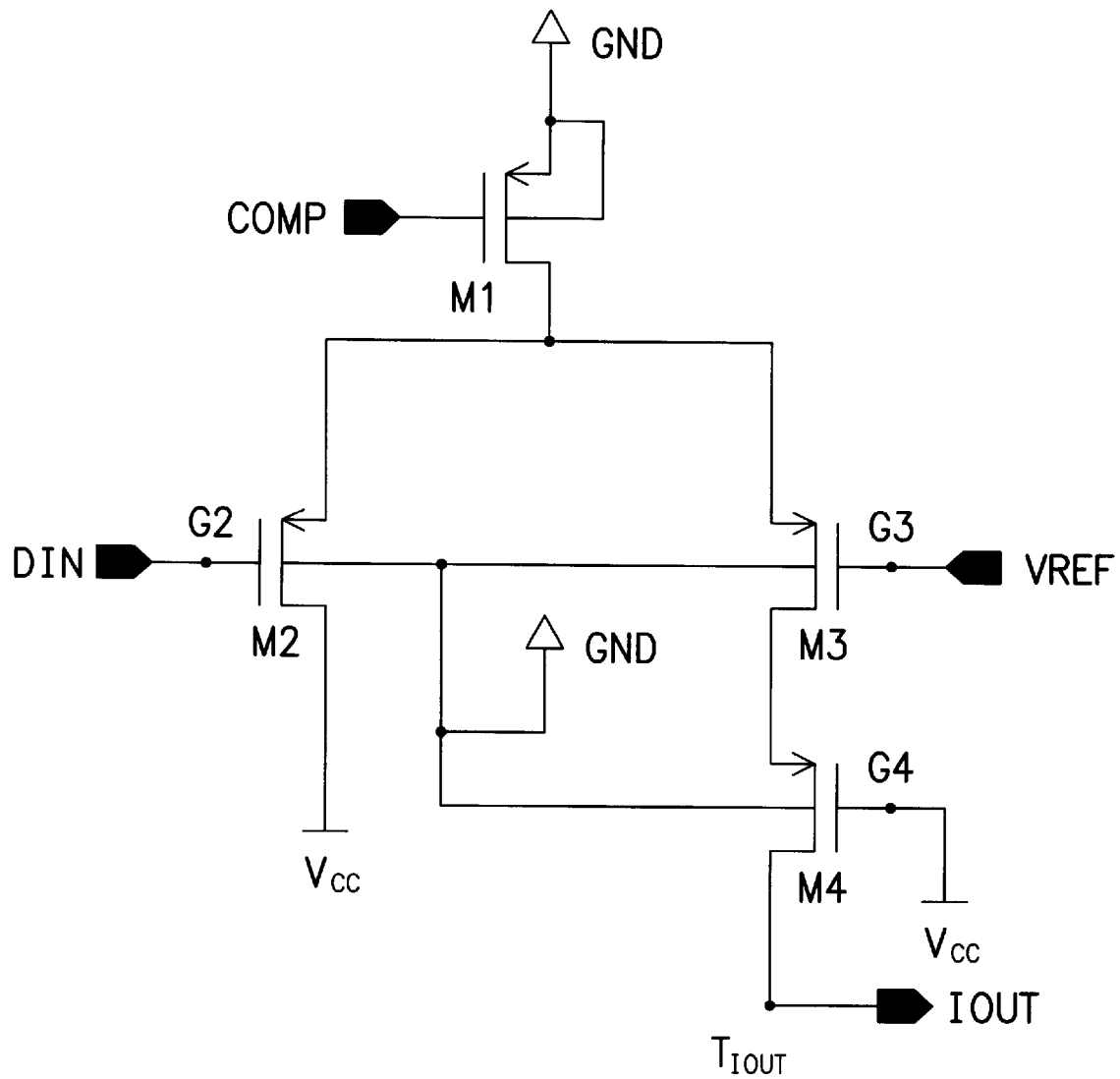
FIG. 5 is another schematic circuit diagram of the current-switching circuit for DAC according to the invention.

In the foregoing preferred embodiment, PMOS transistors are used to implement the current-switching circuit. However, NMOS transistors can also be used in place of the PMOS transistors to implement the current-switching circuit as shown in FIG. 5. In this case, the substrate of every one of the NMOS transistors is connected to the ground instead of to the system voltage $V_{CC}$, and the gate G4 of the fourth MOS transistor M4 is connected to a fixed voltage.

Figure 1:
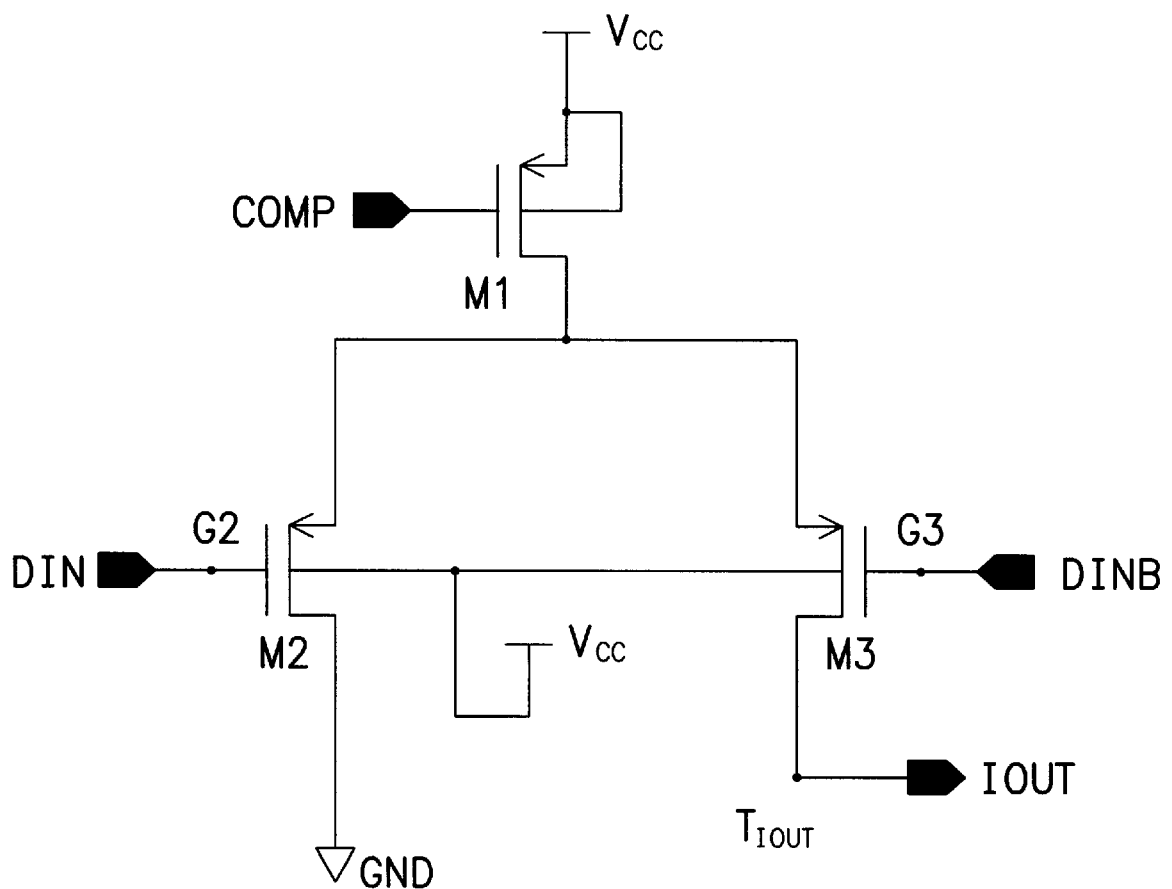
FIG. 1 is a schematic circuit diagram of a first conventional current-switching circuit for DAC.
Figure 2:
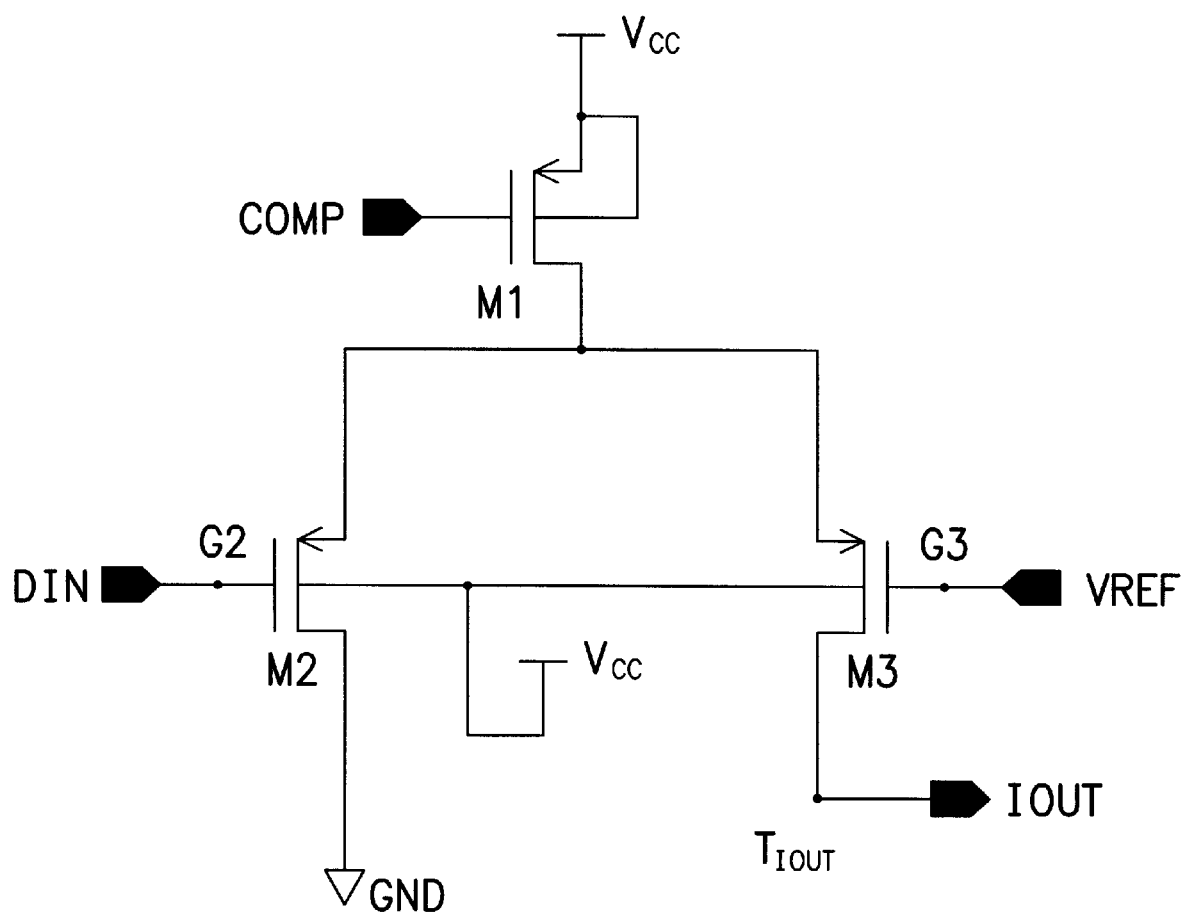
FIG. 2 is a schematic circuit diagram of a second conventional current-switching circuit for DAC.
Figure 4A:
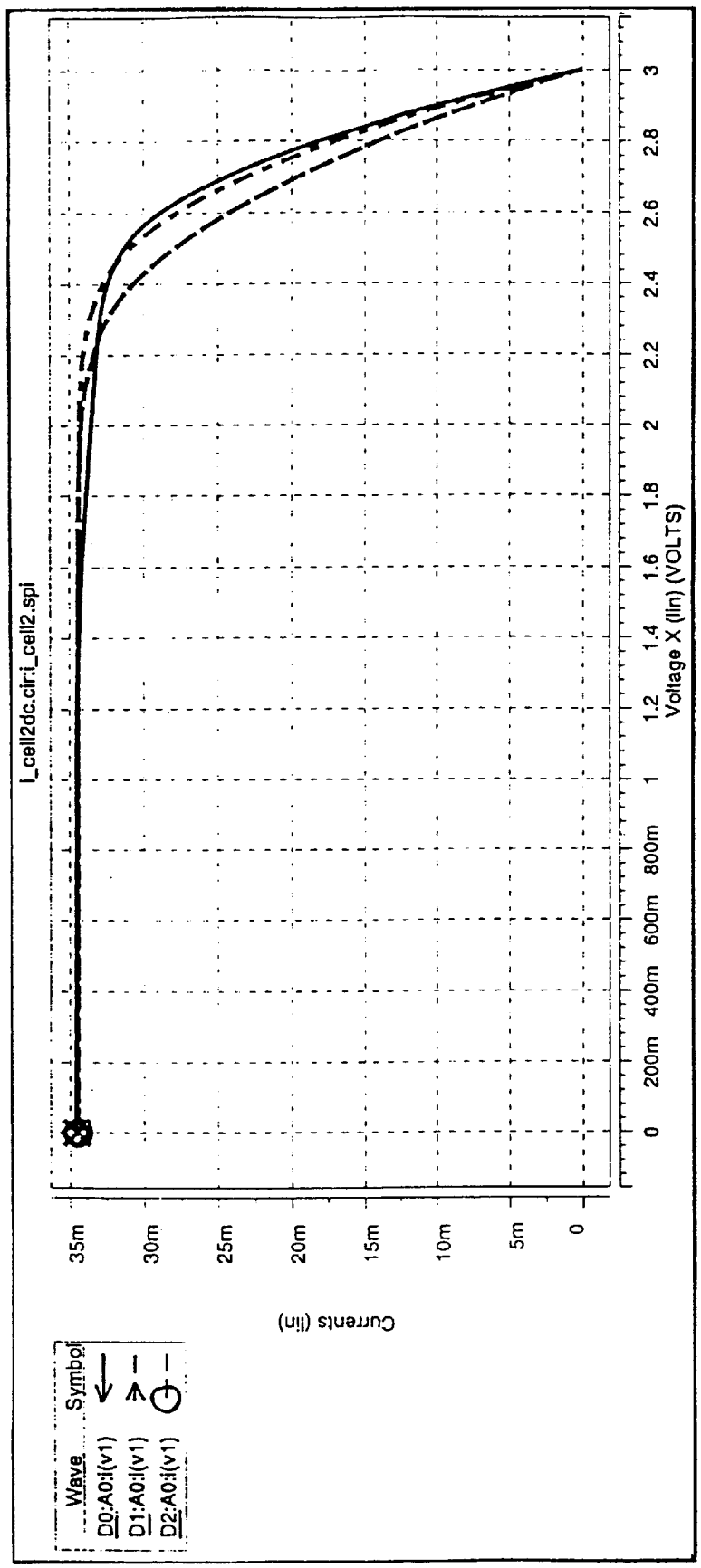
FIGS. 4A and 4B are graphs, showing the SPICE simulation results for the current-switching circuit of the invention shown in FIG. 3 and the two conventional ones shown respectively in FIGS. 1 and 2.
Figure 4B:
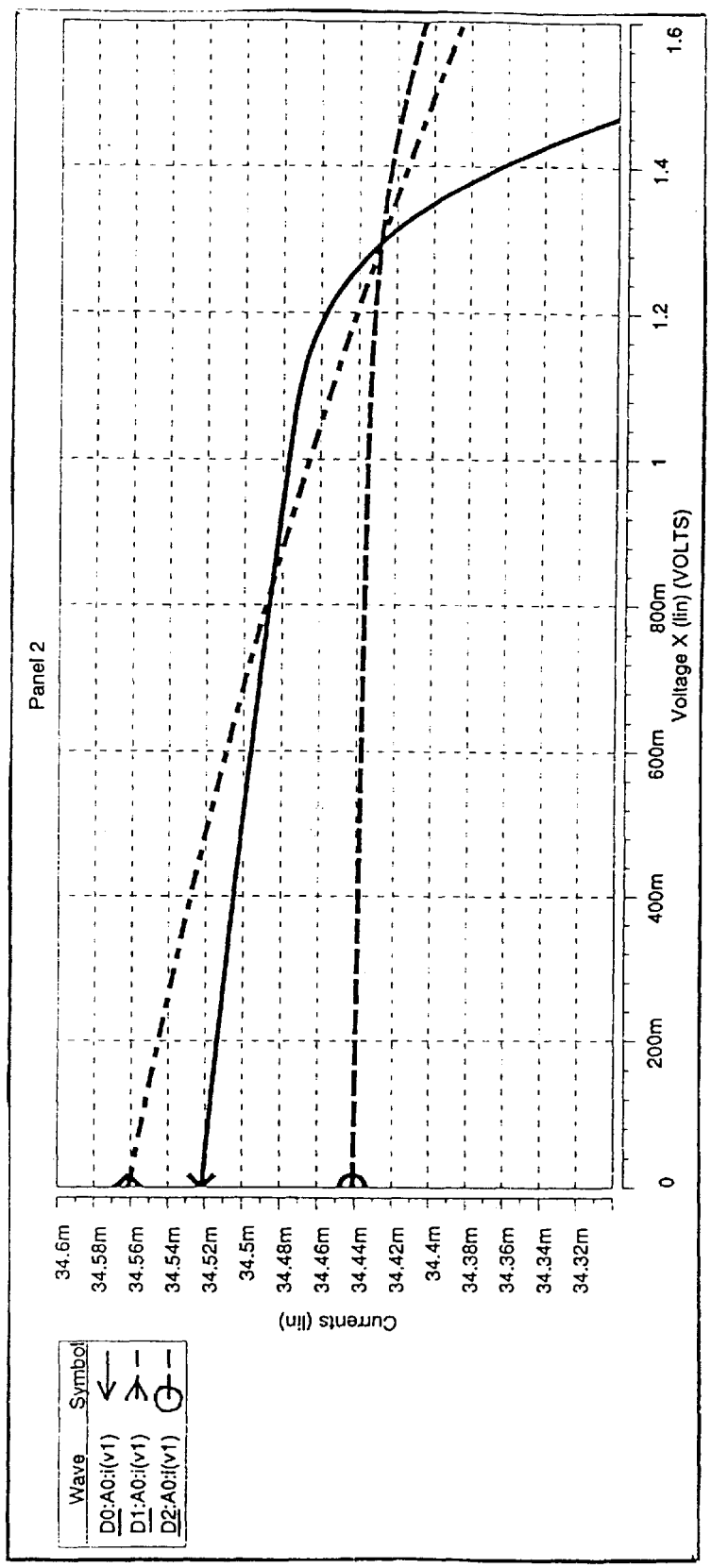

FIGS. 4A and 4B are graphs showing the SPICE simulation results for the current-switching circuit of the invention shown in FIG. 3 and the two conventional ones shown respectively in FIGS. 1 and 2. The plot designated by D0 shows the simulated result for the prior art of FIG. 1; the plot designed by D1 shows that for the prior art of FIG. 2; and the plot designated by D2 shows that for the current-switching circuit of the invention shown in FIG. 3.

It can be seen from the graph of FIGS. 4A and 4B that the output compliance of the prior art of FIG. 1 is 0.4 V, which is unsatisfactory; and the output compliance of the prior art of FIG. 2 is 0.21 V, which is also unsatisfactory. By contrast the output compliance of the current-switching circuit of the invention shown in FIG. 3 is 1.38 V, which is above the minimally required level of 1.2 V.

Furthermore, from the paper "An 80-MHz 8-bit CMOS D/A Converter" published in IEEE JSSCC. VOL. SC-21, NO. 6, the integral linearity error E of the current-switching circuit is found to satisfy the following relationship:

$$E = \tfrac{1}{4} * g * RL$$

where g is the output conductance of the current-switching circuit; and

RL is the output load of the current-switching circuit, typically set at 37.5Ω.

From this equation, the integral linearity error of the prior art of FIG. 1 is E=2.6 LSB; the integral linearity error of the prior art of FIG. 2 is E=2.4 LSB; and the integral linearity error of the current-switching circuit of the invention shown in FIG. 3 is E=0.4 LSB, where 1 LSB=$2^{-10}$=$\tfrac{1}{1024}$. Therefore, the current-switching circuit of the invention can meet the required 10 bits linearity in the output current characteristic.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A current-switching circuit for outputting an electrical current switchably controlled by an input digital signal, which comprises:
   a fixed current source for supplying a fixed current;
   a first MOS transistor whose gate is connected to receive the input digital signal, with one of the source/drain ends thereof being connected to the output end of the fixed current source and the other being connected to a first voltage voltage;
   a second MOS transistor whose gate is connected to receive a fixed reference voltage whose magnitude is set between a logic-high and a logic-low voltage states of the input digital signal, with one of the source/drain ends thereof being connected to the output end of the fixed current source and the other being connected to a node; and
   a third MOS transistor whose gate is connected to a the first voltage that sets the third MOS transistor at a permanently-ON state, with one of the source/drain ends thereof being connected to the node connected to the second MOS transistor, and the other one of the source/drain ends serving as the output port of the current-switching circuit.

2. The circuit of claim 1, wherein the fixed current source is a fourth MOS transistor with one of the source/drain ends thereof being connected to a second voltage and the other one of the source/drain ends serving as the output end of the fixed current output.

3. The circuit of claim 1, wherein the first, second, and third MOS transistors are all PMOS transistors.

4. The circuit of claim 3, wherein the substrate of every one of the PMOS transistors is connected to a system voltage.

5. The circuit of claim 3, wherein the fixed current source is connected in such a manner that its substrate is connected to its source.

6. The circuit of claim 5, wherein the first voltage is a ground voltage, while the fixed current source is connected to a system voltage.

7. The circuit of claim 2, wherein the first, second, third and fourth MOS transistors are all PMOS transistors.

8. The circuit of claim 7, wherein the substrate of every one of the PMOS transistors is connected to a system voltage.

9. The circuit of claim 7, wherein the fourth transistor is connected in such a manner that its substrate is connected to its source.

10. The circuit of claim 9, wherein the first voltage is a ground voltage, while the second voltage is the system voltage.

11. The circuit of claim 1, wherein the first, second, and third MOS transistors are all NMOS transistors.

12. The circuit of claim 11, wherein the substrate of every one of the NMOS transistors is connected to a ground voltage.

13. The circuit of claim 11, wherein the fixed current source is connected in such a manner that its substrate is connected to its source.

14. The circuit of claim 13, wherein the first voltage is a system voltage, while the the fixed current source is connected to the ground voltage.

15. The circuit of claim 2, wherein the first, second, third and fourth MOS transistors are all NMOS transistors.

16. The circuit of claim 15, wherein the substrate of every one of the NMOS transistors is connected to a ground voltage.

17. The circuit of claim 15, wherein the fourth transistor is connected in such a manner that its substrate is connected to its source.

18. The circuit of claim 17, wherein the first voltage is a system voltage point, while the second logic voltage point is the ground voltage.

19. A current-switching method outputting an electrical current switchably controlled by an input digital signal, comprising the steps of:
   providing a fixed current source for supplying a fixed current;
   providing a first MOS transistor whose gate is connected to receive the input digital signal, with one of the source/drain ends thereof being connected to the output end of the fixed current source and the other being connected to a first voltage;
   providing a second MOS transistor whose gate is connected to receive a fixed reference voltage whose magnitude is set between a logic-high and a logic-low voltage states of the input digital signal, with one of the source/drain ends thereof being connected to the output end of the fixed current source and the other being connected to a node; and
   providing a third MOS transistor whose gate is connected to the first voltage that sets the third MOS transistor at a permanently-ON state, with one of the source/drain ends thereof being connected to the node connected to the second MOS transistor, and the other one of the source/drain ends serving as the output port of the current-switching circuit.

20. The method of claim 19, wherein the fixed current source is a fourth MOS transistor with one of the source/drain ends thereof being connected to a system voltage representing the high-voltage logic state of the input digital signal and the other one of the source/drain ends serving as the output end of the fixed current output.

21. The method of claim 19, wherein the first, second, and third MOS transistors are all PMOS transistors.

22. The circuit of claim 20, wherein the first, second, third, and fourth MOS transistors are all PMOS transistors.

23. The method of claim 19, wherein the fixed current source is a fourth MOS transistor with one of the source/drain ends thereof being connected to a ground representing the low-voltage logic state of the input digital signal and the other one of the source/drain ends serving as the output end of the fixed current output.

24. The method of claim 23, wherein the first, second, and third MOS transistors are all NMOS transistors.

25. The circuit of claim 24, wherein the first, second, third, and fourth MOS transistors are all NMOS transistors.

* * * * *